(12) United States Patent
Hao

(10) Patent No.: US 7,052,289 B1
(45) Date of Patent: May 30, 2006

(54) CONDUCTIVE TERMINAL AND THE ELECTRICAL CONNECTOR USING THE CONDUCTIVE TERMINAL

(75) Inventor: Yin Hao, Shanghai (CN)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/537,926

(22) PCT Filed: Jan. 29, 2004

(86) PCT No.: PCT/US2004/002820

§ 371 (c)(1),
(2), (4) Date: Jun. 7, 2005

(87) PCT Pub. No.: WO2004/068642

PCT Pub. Date: Aug. 12, 2004

(30) Foreign Application Priority Data

Jan. 29, 2003 (CN) .............................. 03202282.4

(51) Int. Cl.
*H01R 12/00* (2006.01)
(52) U.S. Cl. ........................................................ 439/83
(58) Field of Classification Search .................. 439/83, 439/876
See application file for complete search history.

(56) References Cited

U.S. PATENT DOCUMENTS

| | | | | |
|---|---|---|---|---|
| 4,946,408 A * | 8/1990 | Garrett et al. | ............... | 439/872 |
| 5,860,838 A * | 1/1999 | Kaneko | ....................... | 439/857 |
| 5,984,694 A * | 11/1999 | Sinclair | ........................ | 439/70 |
| 6,056,558 A * | 5/2000 | Lin et al. | ....................... | 439/83 |
| 6,155,845 A * | 12/2000 | Lin et al. | ........................ | 439/83 |
| 6,319,038 B1 * | 11/2001 | Howell et al. | ............... | 439/342 |
| 6,371,784 B1 * | 4/2002 | Scholz et al. | ................ | 439/342 |
| 6,461,182 B1 * | 10/2002 | Hsu | ............................ | 439/342 |
| 6,461,183 B1 * | 10/2002 | Ohkita et al. | ................ | 439/342 |
| 6,471,534 B1 * | 10/2002 | Lee | .............................. | 439/342 |
| 6,478,598 B1 * | 11/2002 | Szu | ............................. | 439/342 |
| 6,478,599 B1 * | 11/2002 | McHugh et al. | ............ | 439/342 |
| 6,478,637 B1 * | 11/2002 | Ohkita et al. | ................ | 439/857 |
| 6,501,665 B1 * | 12/2002 | Ted | ............................. | 361/808 |
| 6,530,788 B1 * | 3/2003 | Ju | ................................ | 439/83 |
| 6,533,591 B1 * | 3/2003 | Lee | ............................... | 439/83 |
| 6,554,633 B1 * | 4/2003 | Nobuyuki et al. | .......... | 439/342 |
| 6,554,634 B1 * | 4/2003 | Lin et al. | ..................... | 439/342 |
| 6,558,182 B1 * | 5/2003 | Ohkita et al. | ................ | 439/342 |
| 6,565,368 B1 * | 5/2003 | Liao et al. | .................... | 439/83 |
| 6,572,386 B1 * | 6/2003 | Howell et al. | ................ | 439/66 |

(Continued)

*Primary Examiner*—Ross Gushi
(74) *Attorney, Agent, or Firm*—Robert J. Zeitler

(57) ABSTRACT

A conductive terminal and the electrical connector using the conductive terminal, the conductive terminal is received in a terminal channel defined in an insulative housing of the electrical connector which can transmit signal between an electronic component and a circuit board. The conductive terminal has a first wall, a second wall connecting with the first wall in a certain angle and third wall connecting with the second wall in a certain angle and opposite to the first wall. The conductive terminal forms a mounting portion connecting with the solder ball. The mounting terminal forms a mounting portion connecting with the solder ball. The mounting portion comprises a first horizontal portion extending and bending from one end of the first wall toward the third wall, and a second horizontal portion on the third wall and corresponding to the first horizontal portion toward the first wall. A gap is defined between an end of the second horizontal portion and an end of the first horizontal portion near the second horizontal portion so that the first horizontal portion and the second horizontal portion form a structure for locating the solder ball.

14 Claims, 8 Drawing Sheets

U.S. PATENT DOCUMENTS

| | | |
|---|---|---|
| 6,572,397 B1 * | 6/2003 | Ju ............................... 439/342 |
| 6,638,119 B1 * | 10/2003 | Chang ........................ 439/857 |
| 6,669,499 B1 * | 12/2003 | Whyne et al. ............... 439/342 |
| 6,692,265 B1 * | 2/2004 | Kung et al. ................... 439/68 |
| 6,702,594 B1 * | 3/2004 | Lee et al. ..................... 439/83 |
| 6,733,320 B1 * | 5/2004 | Kukita et al. ............... 439/342 |
| 6,773,290 B1 * | 8/2004 | Lai ............................. 439/342 |
| 6,783,375 B1 * | 8/2004 | He ............................... 439/83 |
| 6,824,414 B1 * | 11/2004 | Whyne et al. ............... 439/342 |
| 6,830,471 B1 * | 12/2004 | Okita et al. .................. 439/342 |
| 6,905,377 B1 * | 6/2005 | Murr .......................... 439/862 |
| 6,908,328 B1 * | 6/2005 | Lei et al. ..................... 439/342 |
| 6,979,219 B1 * | 12/2005 | Scholz ....................... 439/342 |
| 2003/0096525 A1 * | 5/2003 | Hsu ............................ 439/342 |
| 2004/0009694 A1 * | 1/2004 | Lai ............................. 439/342 |

* cited by examiner

CONDUCTIVE TERMINAL AND THE ELECTRICAL CONNECTOR USING THE CONDUCTIVE TERMINAL

This application is a 371 of PCT/US04/02820, Jan. 29, 2004.

FIELD OF THE INVENTION

The present invention generally relates to a conductive terminal and, more particularly, to a conductive terminal used in an electrical connector which can transmit signals between an electronic component and a circuit board via a solder ball connected with the circuit board.

BACKGROUND OF THE INVENTION

Referring to FIGS. 1 to 3, as disclosed in T.W. patent application No. 087216147, publication No. 392975, an electrical connector 1 is a zero insertion force ("ZIF") electrical connector for electrically interconnecting a central processing unit ("CPU") and a mainboard used in computer device. The electrical connector 1 comprises an insulative housing 10 and a plurality of conductive terminals 2. Each of the conductive terminals 2 electrically connects with the circuit board 30 through surface mounting technology ("SMT") by pre-setting a solder ball 23 onto an end thereof.

The insulative housing 10 of the electrical connector 1 has a mounting surface 12 on the bottom surface thereof which is positioned proximate to the circuit board 30 and a receiving surface 11 on the top surface thereof for supporting the electronic component. The insulative housing 10 also defines a plurality of through holes 13 extending between the mounting surface 12 and the receiving surface 11.

Each of the conductive terminals 2 respectively received in the corresponding through holes 13 forms a contact portion 20 extending toward the receiving surface 11 and an end portion 21 opposite extending to the mounting surface 12. The end portion 21 has a bottom surface 22 for soldering with the corresponding solder ball 23.

To improve successful rate of pre-setting the solder ball 23 onto the end portion 21 of the conductive terminals 2, the end portion 21 forms a disk-shape plane approximately 90 degrees bending to the contact portion 20 so that the end portion 21 and the mounting surface 12 of the insulative housing 10 are approximately located in the same plane. The plane disk-shape end portion 21 provides a larger area of pre-setting the solder ball 23 so as to steadily pre-set the solder ball 23. In addition, a plurality of protrusions 25 is integrity extending from the side of the end portion 21 for preventing the solder ball 23 dropping from the bottom surface 22 of the end portion 21.

To applying the SMT of pre-setting the solder ball 23, one end of the conductive terminal 2 must have a structure of easily locating and connecting the solder ball 23. The above method is only one of the resolving schemes with which the end portion of the conductive terminal 2 has different structures to locate and connect the solder ball 23. The present invention provides an improved conductive terminal to locate and connect the solder ball 23.

SUMMARY OF THE INVENTION

An object of the present invention is to provide a conductive terminal that easily locates a solder ball and an electrical connector using the conductive terminals.

Another object of the present invention is to provide a conductive terminal enhancing steadiness of soldering with a solder ball.

The conductive terminals of the present invention are received in a plurality of terminal channels of an insulative housing of the electrical connector which can transmit signals between an electronic component and a circuit board.

The conductive terminal has a first wall, a second wall connecting with the first wall in a certain angle and a third wall connecting with the second wall in a certain angle and opposite to the first wall. The conductive terminal forms a contact portion electrically connecting with the electronic component and a mounting portion electrically connecting with the circuit board via the solder ball. The mounting portion comprises a first horizontal portion extending and bending from one end of the first wall toward the third wall, and a second horizontal portion on the third wall and corresponding to the first horizontal portion toward the first wall. A gap is defined between an end of the second horizontal portion and an end of the first horizontal portion near the second horizontal portion so that the first horizontal portion and the second horizontal portion form a structure for locating the solder ball.

The first horizontal portion defines a first recess at its end thereof and the second horizontal portion defines a second recess at its end thereof. The first recess and the second recess form a concavity structure which connects the surface of the solder ball.

When the solder ball contacts with the mounting portion, the solder ball can be received and located in the concavity structure defined by the first recess and the second recess. Tin of the melting solder ball flow into the gap between the first horizontal portion and the second horizontal portion so as to enhance steadiness of soldering between the solder ball and the mounting portion.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE DISCLOSED EMBODIMENTS

Figure 1:
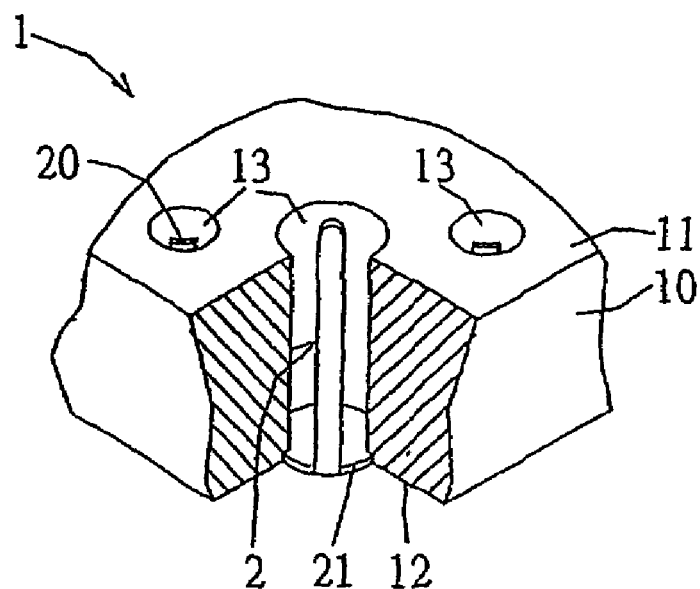
FIG. 1 is a partial sectional view illustrating a conventional electrical connector.
Figure 2:
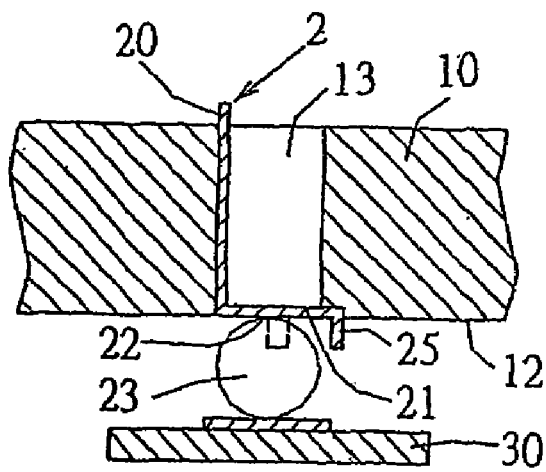
FIG. 2 is a side partial sectional view illustrating of FIG. 1.
Figure 3:
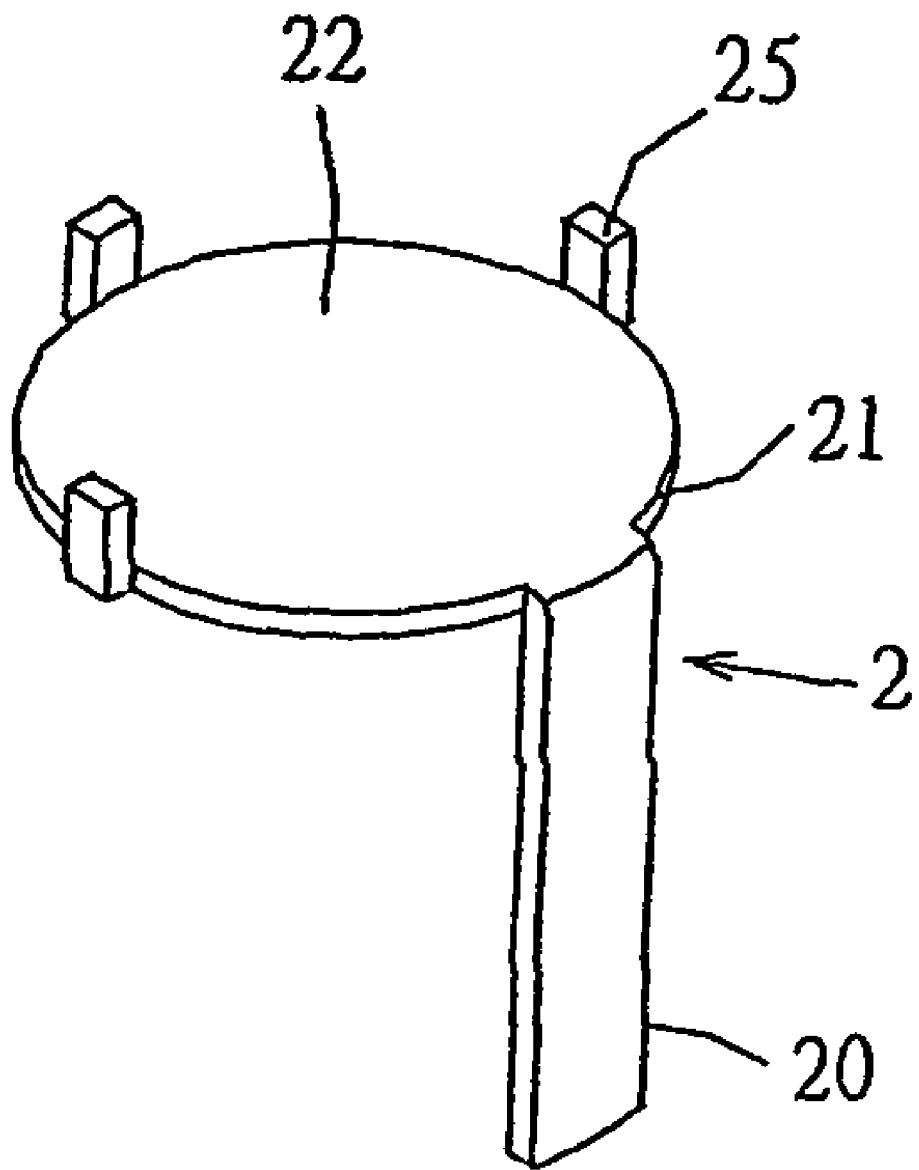
FIG. 3 is a perspective view of a conductive terminal of the conventional electrical connector of FIG. 1.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 4:
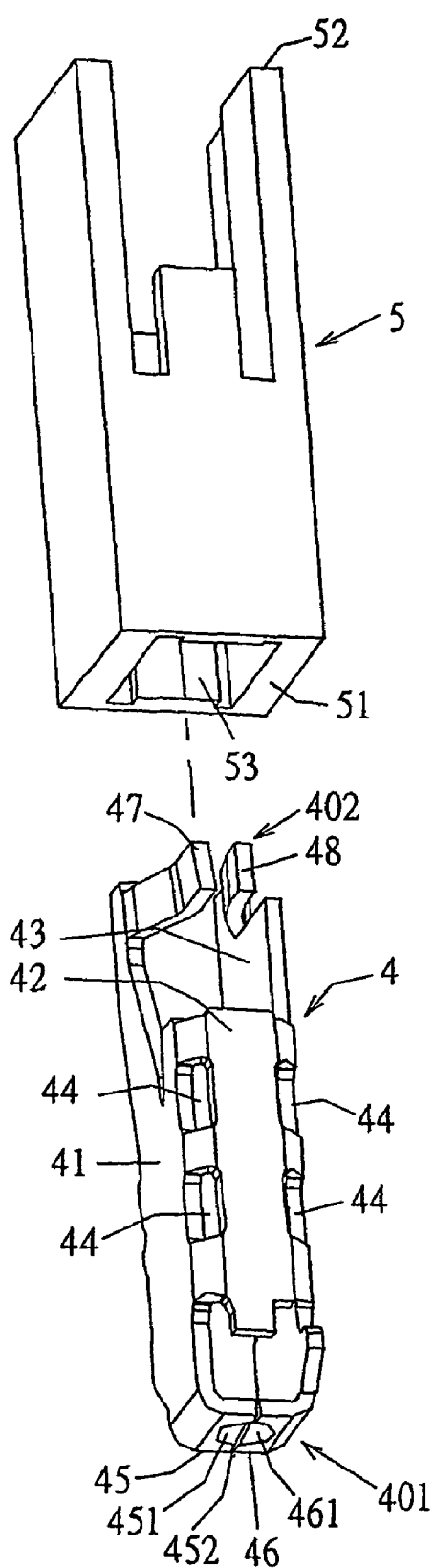
FIG. 4 is a perspective view of a conductive terminal inserting into a terminal channel of an insulative housing of the first embodiment of the present invention from under the insulative housing.
Figure 5:
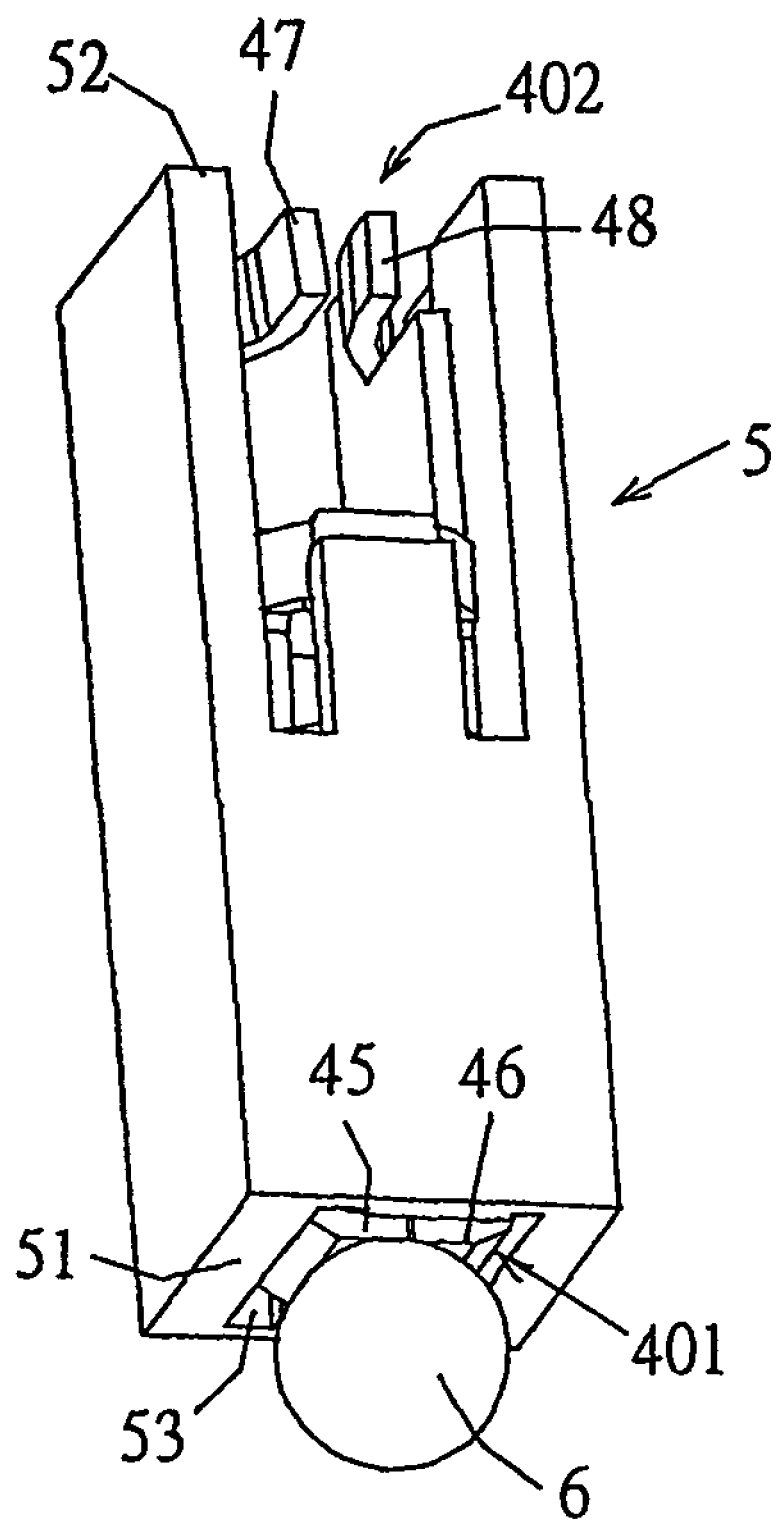
FIG. 5 is a perspective-assembled view of FIG. 4 illustrating a solder ball located in a mounting portion of the conductive terminal of the present invention.

Referring now to FIG. 4 and FIG. 5, a conductive terminal 4 of the present invention used in an electrical connector is similar with the prior art and connects between an electronic component (not shown) and a circuit board (not shown). The conductive terminal 4 pre-sets a solder ball 6 onto an end thereof.

The electrical connector comprises an insulative housing 5 and a plurality of conductive terminals 4.

The insulative housing 5 has a mounting surface 51 which is positioned proximate to the circuit board (such as motherboard of a computer) and a receiving surface 52 for supporting the electronic component (such as central processing unit, "CPU"). The insulative housing 5 defines a plurality of terminal channels 53 extending through the mounting surface 51 and the receiving surface 52. To easily illuminate, it is drawn in the FIG. that the insulative housing 5 has a single terminal channel 53.

Each conductive terminal 4 is respectively received in the corresponding terminal channels 53. The conductive terminal 4 has a first wall 41, a second wall 42 connecting with one side of the first wall 41 in an approximately 90 degrees angle and a third wall 43 connecting with the other side of the second wall 42 in an approximately 90 degrees angle and opposite to the first wall 41 in some distance. The connecting corner of the first wall 41 and the second wall 42 defines a plurality of hollows 44 so as to make the connecting corner of the first wall 41 and the second wall 42 have lower intensity and the first wall 41 easily bend along the hollows 44. Similarly, the connecting corner of the third wall 43 and the second wall 42 defines a plurality of hollows 44 so as to make the third wall 43 easily bend along the hollows 44 to the second wall 42. When the conductive terminal 4 is respectively received in the corresponding terminal channel 53, one end of the conductive terminal 4 adjacent to the mounting surface 51 forms a mounting portion 401 and the opposite end to the mounting portion 401 of the conductive terminal 4 adjacent to the receiving surface 52 forms a contact portion 402.

The mounting portion 401 comprises a first horizontal portion 45 extending and bending in an approximately 90 degrees from one end of the first wall 41 adjacent to the mounting surface 51 toward the third wall 43, and a second horizontal portion 46 extending and bending in an approximately 90 degrees angle from the third wall 43 adjacent to the mounting surface 51 toward the first wall 41 so that a gap 452 is defined by the ends of the first horizontal portion 45 and the second horizontal portion 46. In this embodiment, referring to FIG. 5, the first horizontal portion 45, the second horizontal portion 46 and the mounting surface 51 of the insulative housing 5 are approximately in a same plane. The first horizontal portion 45 defines a first recess 451 semicircle depressed to the terminal channel 53 and the second horizontal portion 46 defines a second recess 461 semicircle depressed to the terminal channel 53. The first recess 451 and the second recess 461 forms a concavity structure for receiving the solder ball 6.

The contact portion 402 comprises a first spring arm 47 formed on one side of the first wall 41 adjacent to the receiving surface 52 and a second spring arm 48 formed on one side of the second wall 42 adjacent to the receiving surface 52. A free end of the first spring arm 47 and a free end of the second spring arm 48 are adjacent to form a spring receiving structure to provide an insert arm of an electrical component (not shown) inserting. Because the contact portion 402 is not the point of novelty of the present invention and its principle of electrically connecting is similar with a corresponding structure of the conductive terminal of the ZIF electrical connector (not shown), here it is not illuminated in detail.

Figure 6:
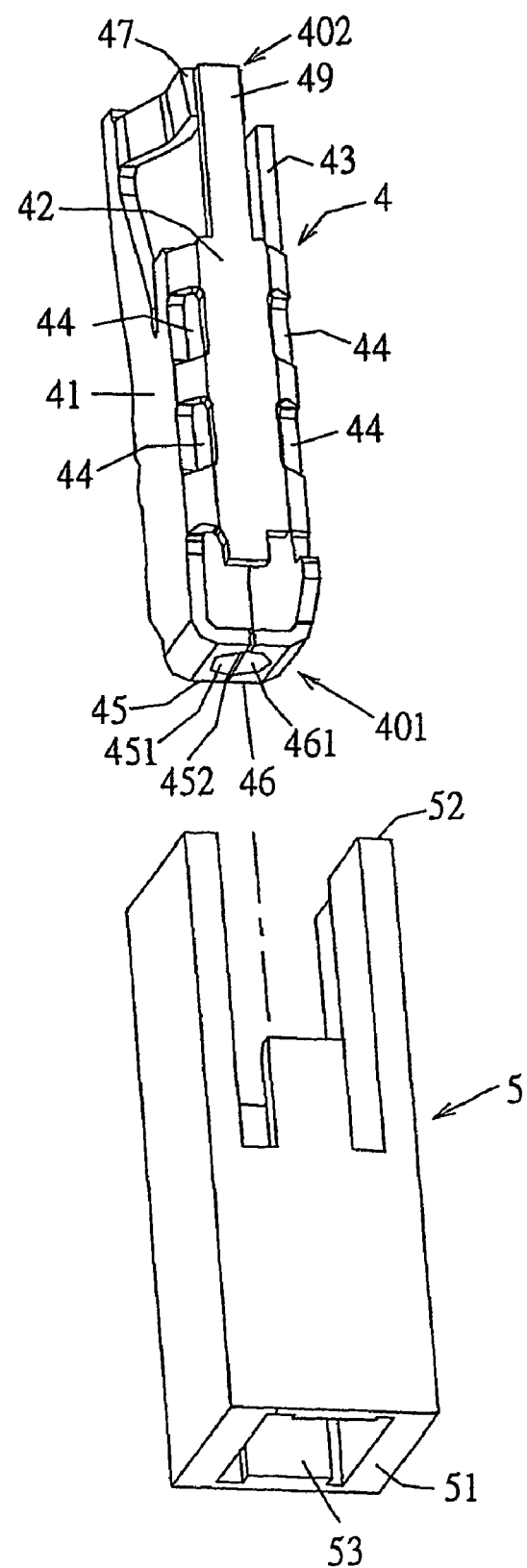
FIG. 6 is a perspective view of the conductive terminal inserting into the terminal channel of the insulative housing of the first embodiment from the above of the insulative housing.

Referring to FIG. 4 to FIG. 6, in assembly, the conductive terminal 4 can insert the corresponding terminal channels 53 of the insulative housing 5 from the mounting surface 51 of the insulative housing 5 (referring to FIG. 4) and the conductive terminal 4 can also insert the corresponding terminal channels 53 of the insulative housing 5 from the receiving surface 52 of the insulative housing 5 (referring to FIG. 6). When the conductive terminal 4 can insert the corresponding terminal channels 53 of the insulative housing 5 from the mounting surface 51 of the insulative housing 5, the mounting portion 401 of the conductive terminal 4 can hold the inserting conductive terminal 4. Contrary, when the conductive terminal 4 can also insert the corresponding terminal channels 53 of the insulative housing 5 from the receiving surface 52 of the insulative housing 5, one end of the second wall 42 forms a handle 49 corresponding to the first spring arm 47 and the second spring arm 48 to hold the inserting conductive terminal 4.

Referring to FIG. 4 and FIG. 5, the mounting portion 401 of the conductive terminal 4 locates the solder ball 6 by its first horizontal portion 45 and the second horizontal portion 46. The first recess 451 defined at the end of the first horizontal portion 45 and the second recess 461 defined at the end of the second horizontal portion 46 form a concavity structure which connects the surface of the solder ball 6. When the solder ball 6 contacts with the mounting portion 401, the solder ball 6 can be received and located in the concavity structure defined by the first recess 451 and the second recess 461. So the solder ball 6 need not accurately align the middle of the mounting portion 401 and easily to locate in the first recess 451 and the second recess 461.

Figure 7:
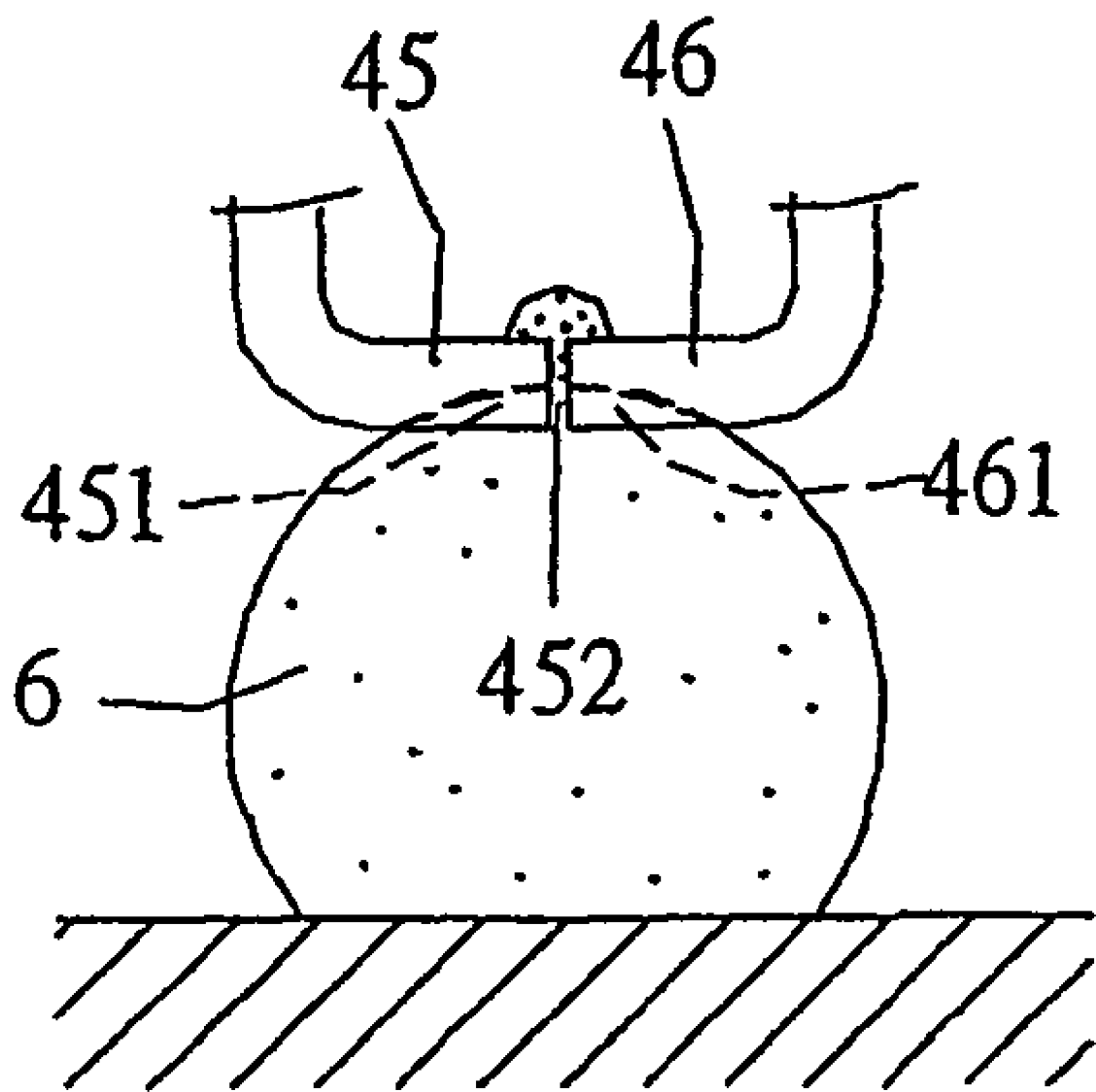
FIG. 7 is a side view of the solder ball melting and connecting with the conductive terminal of the first embodiment.

Referring to FIG. 7, a gap 452 is defined between an end of the second horizontal portion 46 and an end of the first horizontal portion 45 near the second horizontal portion 46. When the solder ball 6 melts, tin flow into the gap 452 so that the solder ball 6 not only can respectively solder with the surfaces of the first horizontal portion 45 and the second horizontal portion 46 but also some tin of the solder ball 6 fasten in the gap 452 by embedding so as to enhance steadiness of soldering between the solder ball 6 and the mounting portion 401 of the conductive terminal 4.

Figure 8:
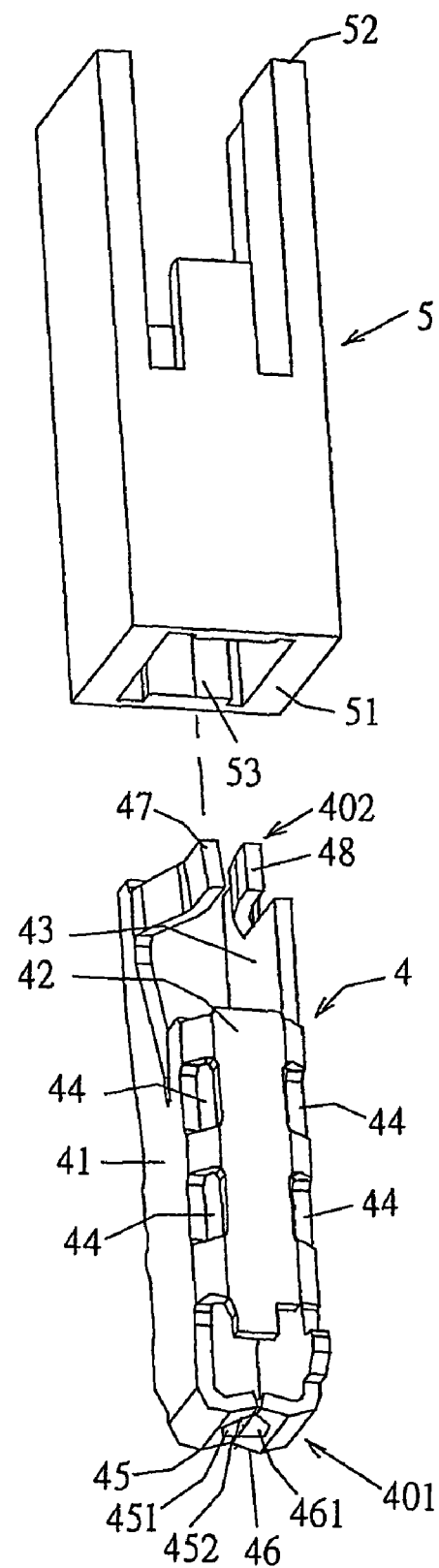
FIG. 8 is a perspective view of the conductive terminal of the second embodiment of the present invention.
Figure 9:
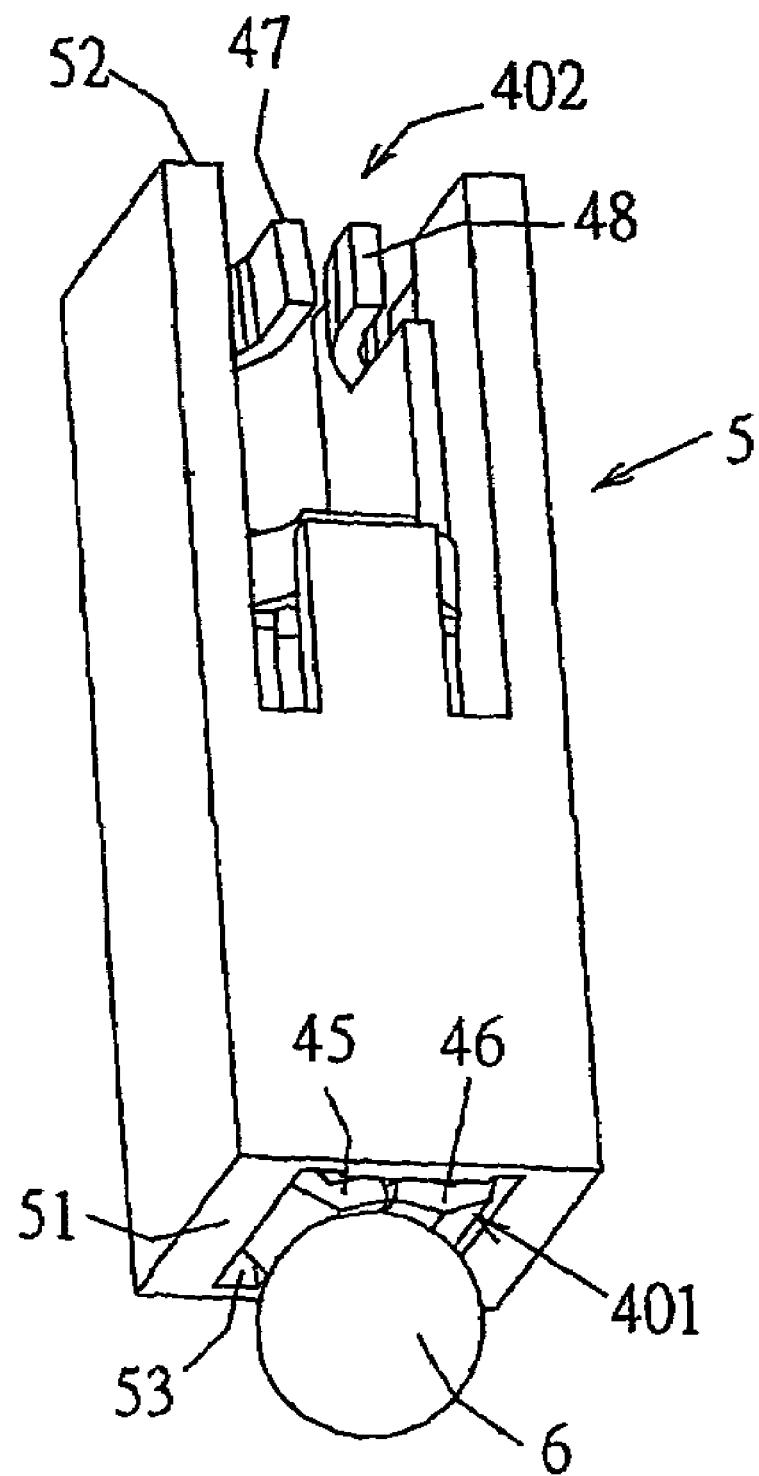
FIG. 9 is a perspective-assembled view of FIG. 8 illustrating the solder ball located in the mounting portion of the conductive terminal of the present invention.

Referring to FIG. 8 and FIG. 9, the conductive terminal 4 of the second embodiment of the present invention is a little different from the first embodiment of the present invention. The first horizontal portion 45 and the second horizontal portion 46 of the conductive terminal 4 bend toward the terminal channels 53 so that the first horizontal portion 45 and the second horizontal portion 46 extend in a direction towards the contact portion 402. As such, the first horizontal portion 45 and the second horizontal portion 46 have less than 180 degrees angle and are not in the same plane. The first horizontal portion 45 and the second horizontal portion 46 form a concavity space toward the terminal channels 53 so that when the solder ball 6 contacts with the mounting portion 401, the solder ball 6 can easily be received and located in the mounting portion 401 defined by the first recess 451 and the second recess 461.

The conductive terminal 4 has the first wall 41, the second wall 42 and the third wall 43. The conductive terminal 4 enhances steadiness of locating the solder ball 6 via the mounting portion 401 defined by the first horizontal portion 45 extending from the first wall 41 and the second horizontal portion 46 extending from the third wall 43 and the locating space defined by the first recess 451 defined at the end of the first horizontal portion 45 and the second recess 461 defined at the end of the second horizontal portion 46. The gap 452 is defined between an end of the second horizontal portion 46 and an end of the first horizontal portion 45 near the second horizontal portion 46 to make tin of the melting solder ball 6 flow therein and enhance steadiness of soldering with the solder ball 6.

Although the present invention has been illustrated and described with respect to exemplary embodiment thereof, it should be understood by those skilled in the art that the various changes, omissions and additions may be made therein and thereto without departing from the spirit and scope of the present invention as set forth in the appended claims.

What is claimed is:

1. A conductive terminal capable of being received in a terminal channel defined in an insulative housing and between an electronic component and a circuit board, having a contact portion electrically connecting with the electronic component and a mounting portion electrically connecting with the circuit board via a solder ball, comprising:

a first wall, a second wall connecting with the first wall in a certain angle and a third wall connecting with the second wall in a certain angle and opposite to the first wall, and the mounting portion comprising a first horizontal portion extending and bending from one end of the first wall toward the third wall, and a second horizontal portion on the third wall and corresponding to the first horizontal portion toward the first wall, a gap defined between an end of the second horizontal portion and an end of the first horizontal portion near the second horizontal portion so that the first horizontal portion and the second horizontal portion form a structure for locating the solder ball.

2. The conductive terminal of claim 1 in which the first horizontal portion and the second horizontal portion are in a same plane.

3. The conductive terminal of claim 2 in which the first horizontal portion, the second horizontal portion and the mounting surface of the insulative housing are in a same plane.

4. The conductive terminal of claim 1 in which the first horizontal portion and the second horizontal portion have a certain angle and bend toward the contact portion of the conductive terminal.

5. The conductive terminal of claim 1 in which the first horizontal portion defines a first recess at its end thereof and the second horizontal portion defines a second recess at its end thereof, the first recess and the second recess form a locating space receiving the solder ball.

6. The conductive terminal of claim 1 in which the contact portion comprises a first spring arm formed on one side of the first wall and a second spring arm formed on one side of the second wall corresponding to the first spring arm, and the first spring arm and the second spring arm form a spring receiving structure to connect with the electrical component.

7. The conductive terminal of claim 1 in which one end of the second wall forms a handle.

8. An electrical connector for connecting between an electronic component and a circuit board via a plurality of solder balls soldering onto the circuit bard, comprising:

an insulative housing forming a mounting surface adjacent to the circuit board and a receiving surface for supporting the electronic component, the insulative housing defining a plurality of terminal channels extending through the mounting surface and the receiving surface; and a plurality of conductive terminals respectively received in the corresponding terminal channels, the conductive terminal having a first wall, a second wall connecting with the first wall and a third wall connecting with the second wall opposite to the first wall, a first horizontal portion extending and bending from one end of the first wall adjacent to the mounting surface toward the third wall, and a second horizontal portion extending from the third wall and corresponding to the first horizontal portion, a gap defined between an end of the second horizontal portion and an end of the first horizontal portion near the second horizontal portion so that the first horizontal portion and the second horizontal portion form a structure for locating the solder ball.

9. The electrical connector of claim 8 in which the first horizontal portion and the second horizontal portion of the conductive terminal are in a same plane.

10. The electrical connector of claim 9 in which the first horizontal portion, the second horizontal portion and the mounting surface of the insulative housing are in a same plane.

11. The electrical connector of claim 8 in which the first horizontal portion, the second horizontal portion have a certain angle and bend toward the contact portion of the conductive terminal.

12. The electrical connector of claim 8 in which the first horizontal portion defines a first recess at its end thereof and the second horizontal portion defines a second recess at its end thereof, the first recess and the second recess form a locating space receiving the solder ball.

13. The electrical connector of claim 8 in which the contact portion comprises a first spring arm formed on one side of the first wall and a second spring arm formed on one side of the second wall corresponding to the first spring arm, and the first spring arm and the second spring arm form a spring receiving structure to connect with the electrical component.

14. The electrical connector of claim 8 in which one end of the second wall of the conductive terminal forms a handle adjacent to the receiving surface.

* * * * *